US006757575B1

United States Patent
Hu

(12) United States Patent
(10) Patent No.: US 6,757,575 B1
(45) Date of Patent: Jun. 29, 2004

(54) SYSTEMS AND METHODS FOR IMPLEMENTING AUDIO DE-CLICKING

(75) Inventor: Fengduo Hu, Cupertino, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 421 days.

(21) Appl. No.: 09/709,247

(22) Filed: Nov. 9, 2000

Related U.S. Application Data

(60) Provisional application No. 60/213,117, filed on Jun. 22, 2000.

(51) Int. Cl.[7] .............................................. G06E 17/00
(52) U.S. Cl. ......................... 700/94; 381/94.5; 381/104
(58) Field of Search ........................... 700/94; 381/94.5, 381/94.1, 109, 104, 107, 105

(56) References Cited

U.S. PATENT DOCUMENTS 5,920,833 A * 7/1999 Dierke ........................ 704/230

6,108,431 A * 8/2000 Bachler ...................... 381/312

FOREIGN PATENT DOCUMENTS

EP 0784400 A2 * 7/1997 ............ H04N/5/44

* cited by examiner

*Primary Examiner*—Melur Ramakrishnaiah
(74) *Attorney, Agent, or Firm*—Charles J. Kulas; Carpenter & Kulas, LLP

(57) ABSTRACT

Digital signal processing systems and methods for smoothing out an audio signal having an abrupt transition in volume. A DSP in an audio visual recording device is configured to smooth out discontinuous volume transitions in an audio signal during encoding. Such abrupt, discontinuous changes can occur when a user instructs the recording device to pause and resume during recording or when the user changes channels during recording. The DSP applies a transform that linearly increases or decreases the volume over one or more audio frames from the first volume level to the next volume level after the abrupt change.

19 Claims, 4 Drawing Sheets

SYSTEMS AND METHODS FOR IMPLEMENTING AUDIO DE-CLICKING

CROSS-REFERENCES TO RELATED APPLICATIONS

This application is related to U.S. Provisional Patent Application No. 60/213,117, filed Jun. 22, 2000, entitled "Audio De-Clicking Schemes in A/V-HDD System," the disclosure of which is hereby incorporated by reference in its entirety for all purposes.

BACKGROUND OF THE INVENTION

The present invention relates generally to signal processing systems and methods and more particularly to systems and methods for processing audio signals in an audio/visual (A/V) recording device to remove abrupt changes in volume.

In a typical A/V recording system, a user is able to pause and resume recording of an A/V program. For example, a user may desire to "pause" while recording a television program when a commercial begins. Selecting pause will cause the audio level recorded to change instantly from the current level to zero. When the program resumes and "resume" recording is selected by the user, the audio level will change instantly from zero back to the current level. Such abrupt transitions in the recorded audio signal will typically produce a noticeable "click" in the playback audio.

Accordingly, it is desirable to provide systems and methods for processing audio signals in an A/V recording device so as to remove noticeable abrupt transitions, such as "clicks", in the playback audio.

SUMMARY OF THE INVENTION

The present invention provides signal processing systems and methods for removing undesirable transitions in an audio signal, and more particularly for smoothing out discontinuous, abrupt changes in amplitude in an audio signal, such as abrupt changes in volume from the current level to zero and back to the current level. The present invention is particularly useful for processing audio signals during encoding in an A/V recording device.

According to the invention, digital signal processing systems and methods are provided for smoothing out an audio signal having an abrupt transition in volume. A DSP in an audio visual recording device is configured to smooth out discontinuous volume transitions in an audio signal during encoding. Such abrupt, discontinuous changes can occur when a user instructs the recording device to pause and resume during recording or when the user changes channels during recording. The DSP applies a transform that linearly increases or decreases the volume over one or more audio frames from the first volume level to the next volume level after the abrupt change.

According to an aspect of the present invention, a method of smoothing an audio signal having a volume discontinuity is provided. The method typically includes receiving a digital input signal, wherein the digital input signal represents an analog audio signal sampled a number of times during each of a plurality of frames, and wherein the digital input signal has a discontinuous volume change from a first value to a second value. The method also typically includes applying a transform to the digital input signal to produce a digital output signal having a continuous volume change from the first value to the second value over one or more frames, wherein the transform is a function of the number of samples during a frame and the difference between the first and second values.

According to another aspect of the invention, a method of smoothing an audio signal having a volume discontinuity is provided. The method typically includes sampling an input analog audio signal a number of times during each of a plurality of frames to produce a digital signal, wherein the audio signal includes a discontinuous volume change from a first value to a second value during a first frame. The method also typically includes applying a transform to the digital signal to produce a digital output signal having a continuous volume change from the first value to the second value over one or more frames, wherein the transform is a function of the number of samples taken during a frame and the difference between the first and second values.

According to yet another aspect of the present invention, a device for encoding and recording an audio signal is provided. The device typically includes a first buffer that stores one or more frames of digital audio data representing an analog audio signal sampled a number of times during each of a plurality of frames, wherein the first buffer receives and stores a first frame of digital audio data having a discontinuous volume change from a first level to a second level. The device also typically includes a first digital signal processor coupled to the first buffer and configured to smooth out the discontinuous change in volume, wherein the first digital signal processor applies a transform to the first frame of digital audio data to produce a digital output signal having a continuous volume change from the first level to the second level over one or more frames, wherein the transform is a function of the number of samples taken during each frame and of the first and second levels.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

DESCRIPTION OF THE SPECIFIC EMBODIMENTS

Figure 1:
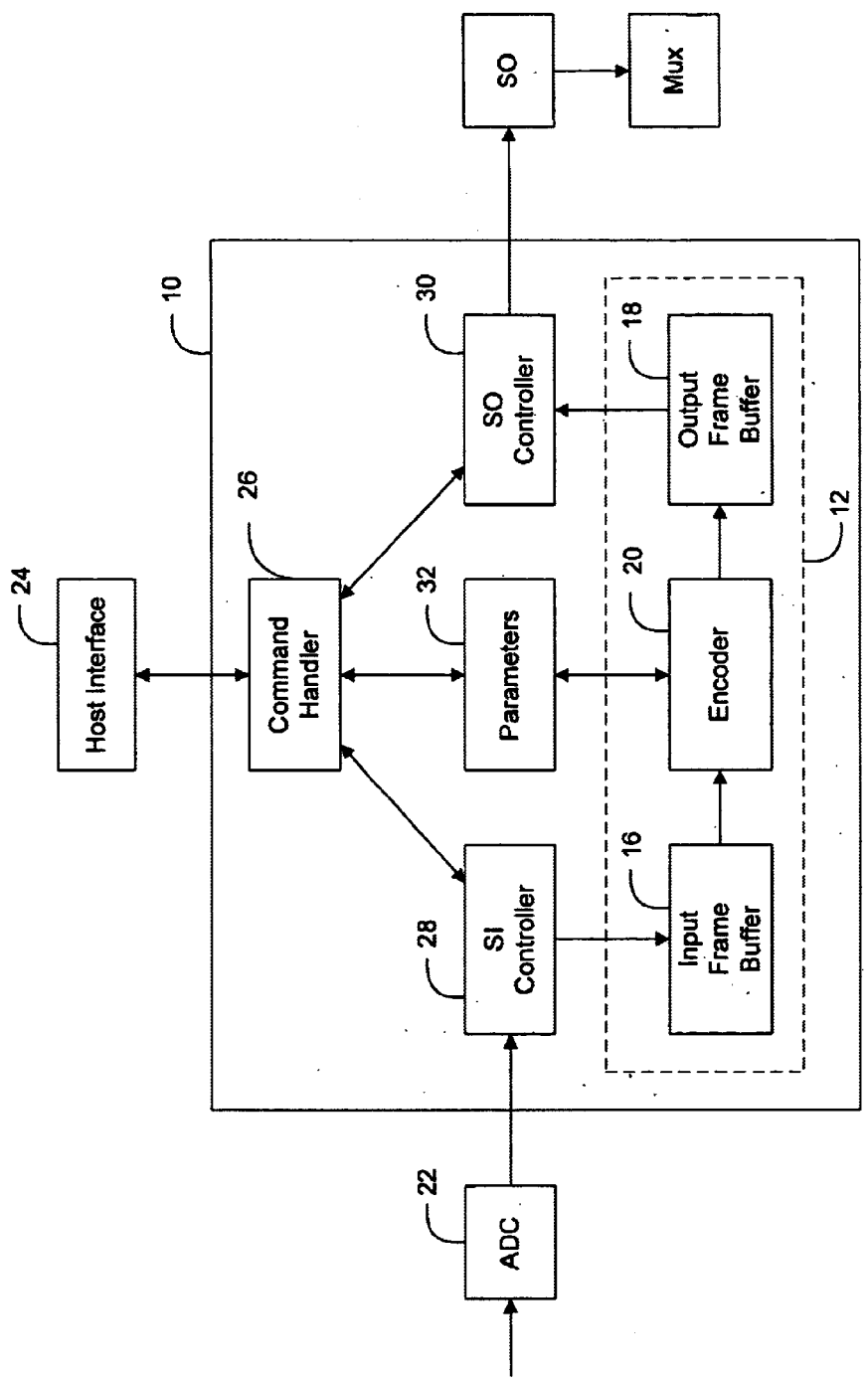
FIG. 1 is a block diagram illustrating portions of an A/V recording device, including an audio encoding module, according to an embodiment of the present invention.

FIG. 1 is a block diagram illustrating an Audio Digital Signal Processor (DSP) 10 including an audio encoding module 12 according to an embodiment of the present invention. Audio DSP 10 may be integrated in any A/V recording device such as an A/V-HDD device. As shown, encoder module 12 includes two audio frame buffers, input frame buffer 16 and output frame buffer 18, and encoder circuit 20. Audio frame buffers 16 and 18 are preferably implemented in SRAM, although any type of RAM may be used, and are of sufficient size to store two frames of audio data, although the buffers may be smaller or larger as desired for the particular application. Generally, audio frame buffer 16 stores frames of digital audio data received via analog-to-digital converter 22, and provides the data to encoder 20 for encoding. Frame buffer 18 stores frames of digital audio data encoded by encoder 20.

DSP 10 also includes control interface elements, such as a command handler module 26, a serial input (SI) controller 28 and a serial output (SO) controller 30, for controlling operation of DSP 10 in response to commands issued by a host processor and received via host interface 24. Each of command handler 26, SI controller 28 and SO controller 30 may be implemented in hardware or software or both hardware and software. Command handler 26 processes API commands issued by host 24 and provides control instructions and parameters to SI controller 18, SO controller 30, and encoder 20 via parameter module 32. As will be discussed in more detail below, such API commands processed by command handler 26 include "AudioStartEncFade" and "AudioStopEncFade," which may be issued in response to commands to "resume" and "pause" recording, respectively, and "AudioStartMute" and "AudioStopMute," which may be issued in response to a channel change during recording. Parameter module 32 is provided to parse parameters passed to and from command handler 26 and encoder 20. In preferred aspects DSP 10 is integrated into an A/V-HDD or other audio visual recording device for encoding during recording of a program.

SI controller 28 generally controls incoming data in response to API commands. In one embodiment, for example, a command such as SetSIMode( ) is used to set SI controller 28 in a reset mode or a run mode as well as to identify whether data is msb first or lsb first. SO controller 30 generally controls the output data in response to API commands. In one embodiment, for example, commands such as SetSOModeHigh( ) and SetSOModeLow( ) are used to control output data size and whether the output is lsb or msb first. The output data size may be 16, 20 or 24 bit, or more, depending on the DAC used. Additionally, SO controller 30 is used to implement audio muting and unmuting in response to user requests to mute and unmute. Examples of parameters (and values) used in the system include parameters identifying the encoder version, protection bit (e.g., 0 or 1 representing CRC or no CRC), sampling frequency (e.g., [1:0] representing 44.1 kHz, 48 kHz, and 32 kHz), bitrate (e.g., [3:0] representing bitrates from 32 kbits to 448 kbits), and volume control (e.g., [7:0] representing gain in steps such as 0.5 dB).

According to one embodiment, two DSPs are integrated into a recording device to partition the encoding process into two parts. In a first processing part, for example, psycho-acoustic processing of the audio signal is performed, as will be described in more detail below. In a second processing part, a transform is applied to the processed audio signal to remove any discontinuities in volume that would otherwise occur during playback of the encoded, recorded audio signal. Such discontinuities can occur during recording of an audio visual program, for example, when "pause" and "resume" are selected during recording.

Figure 2:
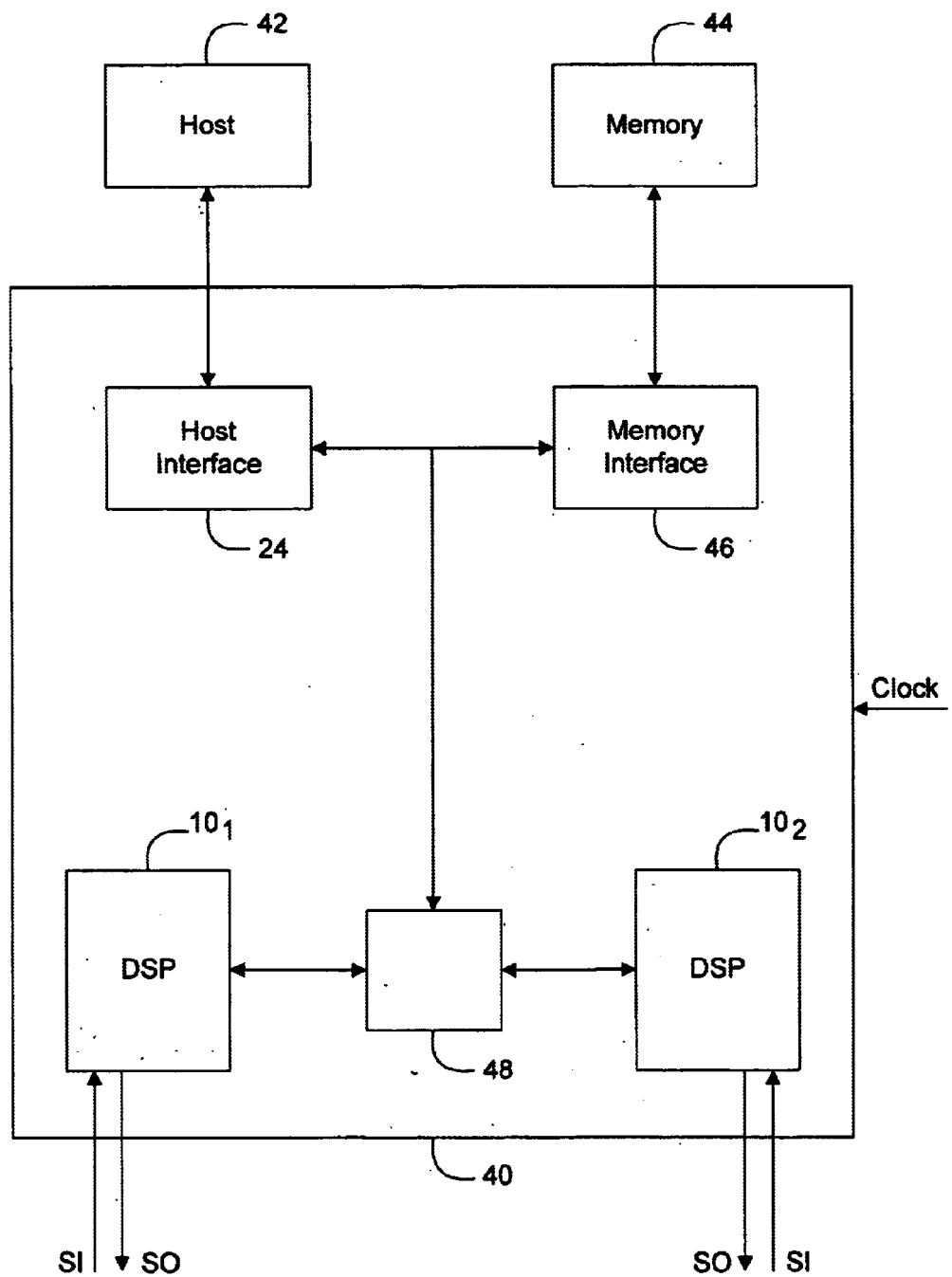
FIG. 2 is a block diagram illustrating an audio signal processing unit including dual DSPs according to one embodiment of the present invention.

FIG. 2 shows a block diagram of a signal processing unit 40 including dual DSPs, $10_1$ and $10_2$, according to one embodiment of the present invention. Processing unit 40 may be incorporated into any A/V recording device, such as an A/V-HDD. In the present embodiment, DSP $10_1$ is configured to perform psycho-acoustic processing of an input audio signal, and DSP $10_2$ is configured to remove discontinuities or abrupt changes in volume. As shown, DSPs $10_1$ and $10_2$ are communicably coupled to each other and to host interface 24 and memory interface 46 through switch registers 48. Host 42 provides commands to the DSPs via host interface 24, and memory 44 provides data via memory interface 46.

Figure 3:
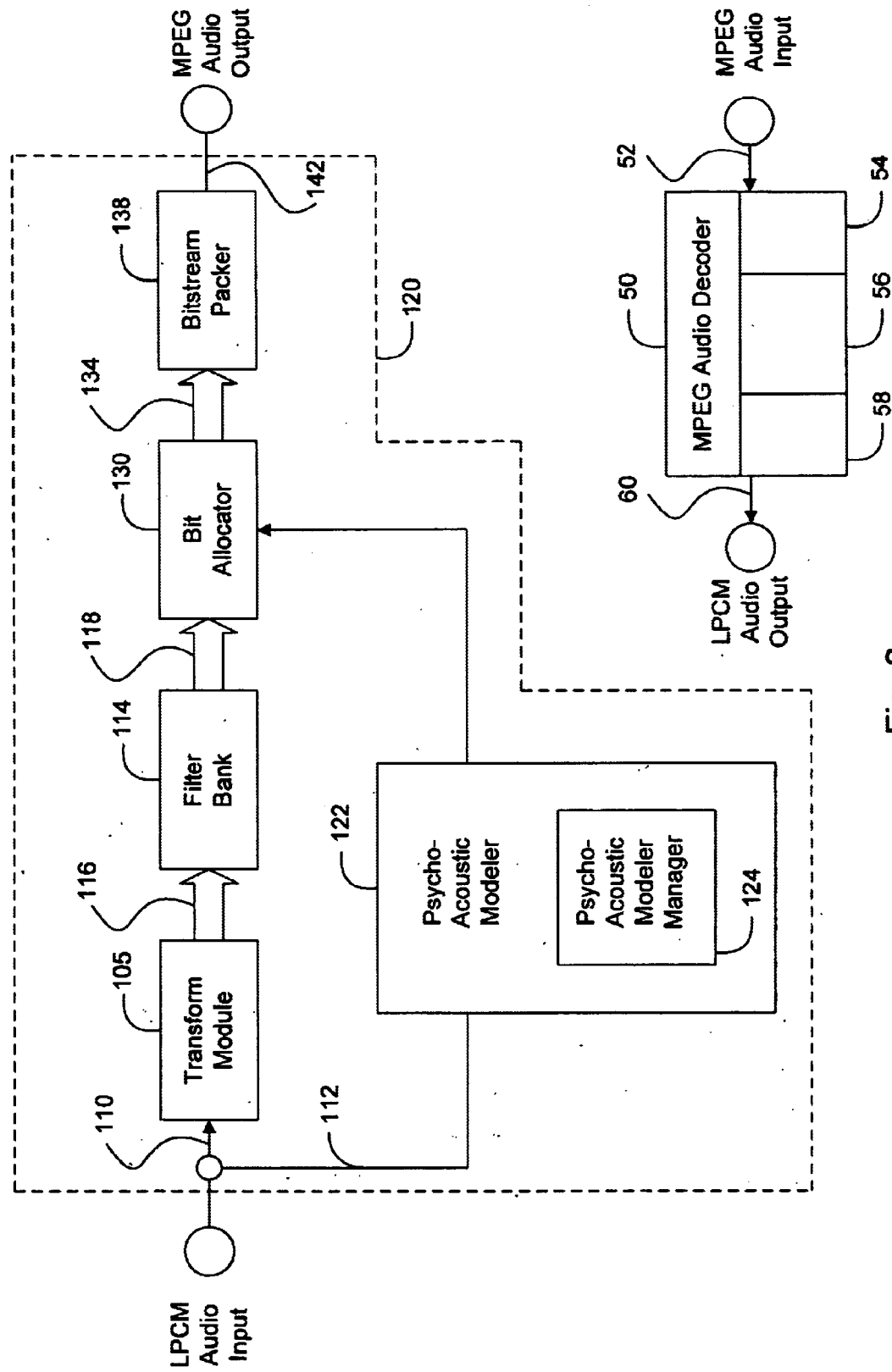
FIG. 3 is a block diagram illustrating aspects of an audio encoding circuit according to an embodiment of the present invention.

FIG. 3 shows a block diagram of an audio encoding circuit 120 (encoder 120) including a transform module 105 and a psycho-acoustic modeler 122 according to one embodiment of the present invention. In the embodiment as shown, encoder 120 is a Media Picture Experts Group (MPEG) audio encoder and includes a transform module 105, a filter bank 114, a bit allocator 130, a psycho-acoustic modeler 122, and a bitstream packer 138. Although the MPEG specification is referred to herein, it will be appreciated that the invention is equally applicable to processing signals in accordance with the Dolby Audio Compression 3 (AC-3) specification as well as any other audio compression standards. Also shown in FIG. 3 is an MPEG audio decoder 50 which includes a bitstream unpacker 54, a frequency sample reconstructor 56 and a filter bank 58. As is well known, MPEG decoder 50 receives MPEG audio signals on input line 52 and decodes the signals to produce LPCM audio signals on output line 60. Together, MPEG encoder 120 and MPEG decoder 50 comprise an MPEG coding/encoding (CODEC) circuit.

In the present embodiment, audio encoder 120 converts uncompressed linear pulse-code modulated (LPCM) audio signals into compressed MPEG audio signals. LPCM audio signals include time-domain sampled audio signals, and in one embodiment the LPCM audio signals include 16-bit digital samples arriving at a sample rate of 48 KHz. The LPCM audio signals enter audio encoder 120 on LPCM audio signal line 110. Transform module 105 processes the LPCM bitstream audio signal to effectively remove abrupt changes in volume in the playback audio signal as will be described in more detail below. Filter bank 114 converts the processed LPCM bitstream 116 into the frequency domain in a number of individual frequency sub-bands.

The frequency sub-bands approximate the 25 critical bands of psycho-acoustic theory. This theory notes how the human ear perceives frequencies in a non-linear manner. To more easily discuss phenomena concerning the non-linearly spaced critical bands, the unit of frequency denoted a "Bark" is used, where one Bark (named in honor of the acoustic physicist Barkhausen) equals the width of a critical band. For frequencies below 500 Hz, one Bark is approximately the frequency divided by 100. For frequencies above 500 Hz, one Bark is approximately 9+41 log(frequency/1000).

In the MPEG standard model, 32 sub-bands are selected to approximate the 25 critical bands. In other embodiments of digital audio encoding and decoding, differing numbers of sub-bands may be selected. Filter bank 114 in one embodiment includes a 512 tap finite-duration impulse response (FIR) filter. This FIR filter yields on digital sub-bands 118 an uncompressed representation of the digital audio in the frequency domain separated into the 32 distinct sub-bands.

Bit allocator 130 acts upon the uncompressed sub-bands by determining the number of bits per sub-band that will represent the signal in each sub-band. It is desired that bit allocator 130 allocate the minimum number of bits per sub-band necessary to accurately represent the signal in each sub-band.

To achieve this purpose, audio encoder 120 includes a psycho-acoustic modeler 122 which supplies information to bit allocator 130 regarding masking thresholds via thresholds signal output line 126. In one embodiment, psycho-acoustic modeler 122 includes a software component called a psycho-acoustic modeler manager 124. When psycho-acoustic modeler manager 124 is executed it performs the functions of psycho-acoustic modeler 122. In particular, psycho-acoustic modeler 122 determines which sounds (frequencies and amplitudes) in the incoming digital audio signal may be safely ignored, or removed, without compromising the playback fidelity as perceived by a human listener.

After bit allocator 130 allocates the number of bits to each sub-band, each sub-band may be represented by fewer bits to advantageously compress the sub-bands. Bit allocator 130 then sends compressed sub-band audio 134 to bitstream packer 138, where the sub-band audio data is converted into MPEG audio formatted signals for transmission on MPEG compressed audio signal line 142.

When an A/V recording device, such as an A/V-HDD, is in the recording mode, a user-input command such as "rec-pause" typically causes the audio level to change instantly from a certain value to 0 during one frame. Similarly, a command such as "release rec-pause" typically causes the audio level to instantly change back to the certain value. This transition can produce a noticeable "click" in the playback audio. In general, the present invention is useful for smoothing out any abrupt changes or discontinuities in volume or amplitude in an input signal. A discontinuity or abrupt change is defined herein as any change that produces a noticeable effect, e.g., a "click" in playback audio. As one example of a discontinuous change in a signal, a discontinuity can be found by taking the derivative of a curve representing the signal which would produce a delta signal at the discontinuity.

According to one embodiment, to effectively remove an abrupt change in volume, such as changes that result in a "click" noise, from the playback audio, an A/V recording device includes a DSP 10 (e.g., DSP $10_2$ in unit 40) having a transform module 105 that applies a transform to the input signal such that the audio level of the output signal grows or decreases linearly from the current level to the desired level within one audio frame duration. As one example, the transform is applied by the transform module 105 when the host 42 issues a command such as "AudioStartEncFade", causing the output signal to grow linearly from 0 to the desired level. Similarly, the audio level is linearly scaled down from the current level to 0 within one audio frame duration when the host 42 issues a command such as "AudioStopEncFade." Another case that may produce a noticeable volume change in the playback audio occurs when the user changes the input channel, e.g., TV channel, while the A/V recording device is in the recording mode. To remove abrupt volume changes in this case, commands such as "AudioStartMute" and "AudioStopMute" are issued by host 42 to control DSP 10 to apply a transform to linearly scale the audio signal from the current level to the desired level. These commands are used when the audio DSP processor is in the encode mode.

Figure 4A:
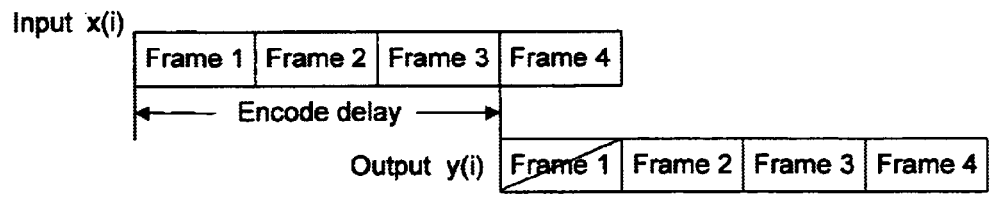
FIGS. 4a–c illustrate examples of the results of a scaling transformation according to an embodiment of the present invention.
Figure 4B:
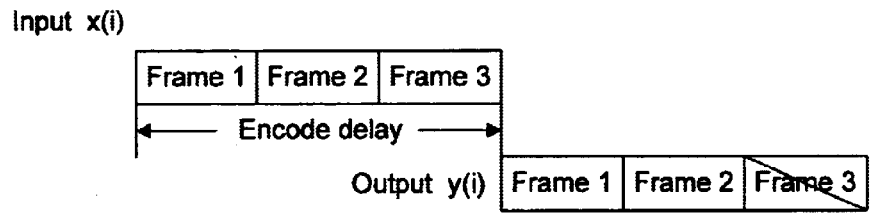
Figure 4C:
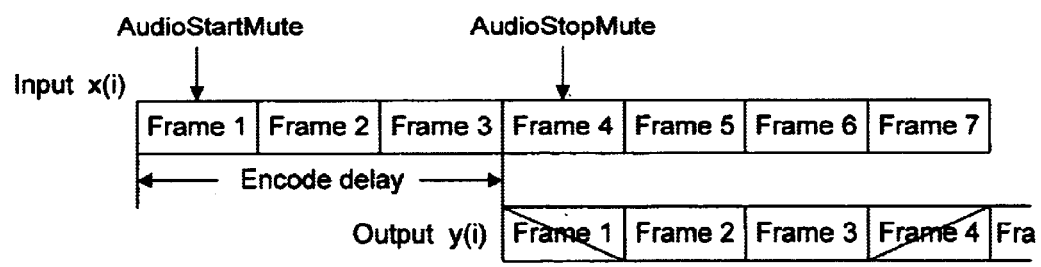

FIGS. 4a–c illustrate examples of the results of a linear scaling transformation according to an embodiment of the present invention. As shown in FIG. 4a, for example, for the API command "AudioStartEncFade", the applied transform produces an output signal that grows linearly from 0 to the desired level during one frame. Similarly, as shown in FIG. 4b, for the command "AudioStopEncFade" the applied transform produces an output signal that decreases linearly from the desired level to 0 during one frame. As shown in FIG. 4c, the transforms applied in response to the "AudioStartMute" and "AudioStopMute" commands result in an output signal that decreases linearly from the current level to 0 during one frame and back to the current level (or another level) during a later frame after a delay of one or more frames between issuance of the commands.

According to one embodiment, the transform applied to the input signal is a function of 1) the difference between the current level of the audio signal and the next level of the audio signal after the abrupt change, 2) the number of samples per frame, and 3) the fading length, e.g., the number of frames over which the signal is to be smoothed. One example is given as $y(i)=k_i* x(i)$, where the input signal is denoted as $x(i)$, the processed signal is denoted as $y(i)$, and k is the applied transform, where $k_{i+1}=k_i+$delta, for i=0, 1, ..., N–1 (the number of samples per frame). The step size of the volume change, delta, is given by: delta=$(V_n-V_c)$/(N*(fading length in frames)), where $V_n$ is the next volume level and $V_c$ is the current volume level.

Examples will now be given for cases where one audio frame length is 1152 samples (N=1152 samples per frame), and where the desired fading length is one frame:

For "AudioStopEncFade":
  current volume=$V_c$
  next volume $V_n=0$
  the step size of volume change, delta=$(V_n-V_c)$/(N*1)=$-V_c$/1152.
  $y(i)=k* x(i)$, k=k+delta, for i=0, 1, ..., 1151

For "AudioStartEncFade":
  current volume $V_c=0$
  next volume $V_n=1$
  the step size of volume change, delta=$(V_n-V_c)$/1152=1/1152.
  $y(i)=k* x(i)$, k=k+delta, for i=0, 1, ..., 1151

For "AudioStartMute":
previous volume=current volume=$V_c$
  next volume $V_n=0$
  the step size of volume change, delta=$(V_n-V_c)$/1152=$-V_c$/1152.
  $y(i)=k* x(i)$, k=k+delta, for i=0, 1, ..., 1151

For "AudioStopMute":
  next volume $V_n$=previous volume $V_p$
  current volume $V_c=0$
  the step size of volume change, delta=$(V_n-V_c)$/1152=$V_p$/1152.
  $y(i)=k* x(i)$, k=k+delta, for i=0, 1, ..., 1151

According to one embodiment of the present invention, an encoding delay of one or more frames is introduced during the encoding process due to buffering and/or psycho-acoustic processing. As one example, as shown in FIGS. 4a–c, an encoding delay of three frames is introduced due to buffering and psycho-acoustic processing in the dual DSP configuration of FIG. 2. With reference to FIG. 4a, audio data for Frame 1 is first buffered, e.g., in an input frame buffer 16. As audio data for Frame 2 is being buffered, psycho-acoustic processing of the audio data for Frame 1 occurs in DSP 101. Thereafter, as audio data for Frame 3 is being buffered, psycho-acoustic processing of the audio data for Frame 2 occurs in DSP $10_1$ as the transform/encoding of the audio data for Frame 1 occurs in DSP $10_2$. Thus, in this specific example, the encoded output signal $y(i)$ is output three frames after the input signal $x(i)$ is presented to signal processing unit 40.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of processing an audio signal, the method comprising:

receiving digital input signal data, wherein the digital input signal data represents a sampled analog audio signal, and wherein the digital input signal data represents a first volume change from a first volume level to a second volume level;

determining whether the first volume change exceeds a predetermined threshold volume change and, if so, applying a transform to the digital input signal data to produce a digital output signal representing a second volume change from the first volume level to the second volume level over one or more frames of data in the digital output signal, wherein the second volume change occurs at a slower rate than the first volume change.

2. The method of claim 1, wherein the method is implemented in an audio visual recording device.

3. The method of claim 1, wherein the transform is proportional to $((V1-V2)/N)$, where V1 is the first volume level, V2 is the second volume level, and N is the number of samples taken during a frame.

4. The method of claim 1, further comprising, prior to applying the transform, using a psycho-acoustic modeler module to remove undesirable components from the digital output signal.

5. The method of claim 1, wherein the determining includes determining that an audio recording is starting.

6. The method of claim 1, wherein the determining includes determining that an audio recording is stopping.

7. A method of processing an audio signal, the method comprising:

sampling an input analog audio signal to produce a first frame of digital signal data that includes a representation of a first volume change from a first volume value to a second volume value;

determining whether the first volume change exceeds a predetermined threshold volume change and, if so, applying a transform to the digital signal data to produce a digital output signal representing a second volume change from the first volume value to the second volume value over one or more frames of data in the output signal, wherein the second volume change occurs at a slower rate than the first volume change.

8. The method of claim 7, wherein transform is proportional to $((V-V2)/N)$, where V1 is the first volume value, V2 is the second volume value, and N is the number of samples taken during a frame.

9. The method of claim 7, further comprising, prior to applying the transform, using a psycho-acoustic modeler module to remove undesirable components from the digital signal.

10. The method of claim 7, wherein the method is implemented in an audio visual recording device.

11. The method of claim 10, wherein the audio visual recording device includes an audio visual hard disk drive.

12. The method of claim 7, wherein each frame corresponds to a video frame.

13. A device, comprising:

a first buffer that stores a first frame of digital audio data representing a sampled analog audio signal, wherein the stored digital audio data represents a first volume change from a first volume level to a second volume level;

a detector for determining whether the first volume change exceeds a predetermined threshold volume change; and a first digital signal processor coupled to the first buffer, wherein the first digital signal processor applies a transform to the first frame of digital audio data to produce a digital output signal having a second volume change from the first volume level to the second volume level over one or more frames in the digital output signal, wherein the second volume change occurs at a slower rate than the first volume change.

14. The device of claim 13, wherein transform is proportional to $((V1-V2)/N)$, where V1 is the first volume level, V2 is the second volume level, and N is the number of samples taken during each frame.

15. The device of claim 13, further comprising a second digital signal processor including a psycho-acoustic modeler module that removes undesirable components from digital audio data, wherein the second digital signal processor removes undesirable components from the digital audio data prior to processing by the first digital signal processor.

16. The device of claim 15, wherein processing in the first and second digital processor introduces a delay of one or more frames to the digital audio data.

17. The device of claim 13, wherein each frame of digital audio data corresponds to a frame of video data.

18. The device of claim 13, wherein the detector detects a command to start an audio recording.

19. The device of claim 13, wherein the detector detects a command to stop an audio recording.

* * * * *